(12) United States Patent
Chen (10) Patent No.: US 9,293,430 B2
(45) Date of Patent: Mar. 22, 2016

(54) SEMICONDUCTOR CHIP AND METHOD OF MANUFACTURING THE SAME

(71) Applicant: Semiconductor Manufacturing International (Shanghai) Corporation, Shanghai (CN)

(72) Inventor: Fucheng Chen, Shanghai (CN)

(73) Assignee: Semiconductor Manufacturing International (Shanghai) Corporation (CN)

( * ) Notice: Subject to any disclaimer, the term of this patent is extended or adjusted under 35 U.S.C. 154(b) by 0 days.

(21) Appl. No.: 14/717,606

(22) Filed: May 20, 2015

(65) Prior Publication Data

US 2015/0380367 A1   Dec. 31, 2015

(30) Foreign Application Priority Data

Jun. 30, 2014   (CN) .......................... 2014 1 0308869

(51) Int. Cl.
*H01L 23/52*   (2006.01)
*H01L 23/00*   (2006.01)

(52) U.S. Cl.
CPC ................ *H01L 24/05* (2013.01); *H01L 24/03* (2013.01); *H01L 24/89* (2013.01); *H01L 2224/03013* (2013.01); *H01L 2224/05022* (2013.01); *H01L 2224/80001* (2013.01); *H01L 2924/0105* (2013.01); *H01L 2924/01029* (2013.01)

(58) Field of Classification Search
CPC .......... H01L 24/05; H01L 24/03; H01L 24/89
USPC ......................................... 257/741
See application file for complete search history.

(56) References Cited

U.S. PATENT DOCUMENTS

| | | | | |
|---|---|---|---|---|
| 6,443,351 | B1 * | 9/2002 | Huang ................ | B23K 3/0623 228/103 |
| 7,507,655 | B2 * | 3/2009 | Sakaguchi .......... | B23K 3/0623 257/E21.508 |
| 7,816,754 | B2 * | 10/2010 | Harvey ............. | H01L 23/49816 257/459 |
| 8,409,979 | B2 * | 4/2013 | Choi ................ | H01L 23/49811 257/738 |

* cited by examiner

*Primary Examiner* — Luan C Thai
(74) *Attorney, Agent, or Firm* — Innovation Counsel LLP (57) ABSTRACT

A chip includes a substrate and a dielectric layer disposed on the substrate. The dielectric layer includes a first dielectric region and a second dielectric region surrounding an outer periphery of the first dielectric region. A top surface of the first dielectric region is disposed below a top surface of the second dielectric region. The chip further includes a metal pad disposed in a through-hole in the first dielectric region and contacting a portion of the substrate.

16 Claims, 5 Drawing Sheets

S401: Providing a substrate, and forming dielectric layer on the substrate, whereby the dielectric layer includes a first dielectric region and a second dielectric region surrounding an outer periphery of the first dielectric region

S402: Forming a metal pad in a through-hole in the first dielectric region, the metal pad contacting a portion of the substrate S403: Etching the dielectric layer so that a top surface of the first dielectric region is disposed below a top surface of the second dielectric region

SEMICONDUCTOR CHIP AND METHOD OF MANUFACTURING THE SAME

CROSS-REFERENCE TO RELATED APPLICATION

This application claims priority to Chinese Patent Application No. 201410308869.2 filed on Jun. 30, 2014, the disclosure of which is incorporated herein by reference in its entirety.

BACKGROUND

1. Technical Field

The present disclosure relates to the field of semiconductor integrated circuit technology, and more particularly to a semiconductor chip and method of manufacturing the same.

2. Description of the Related Art

As the density in semiconductor integrated circuits increases, it becomes increasingly difficult to fit a large number of transistors onto a single chip. Chip stacking technologies can mitigate the above problem. For example, in three-dimensional integrated circuit (3D-IC) technology, vertical interconnects are formed using a bonding process to connect a plurality of chips, and the density of transistors can be increased by vertically stacking the chips. In addition, 3D-ICs have improved operating speed and reduced power consumption. As such, there has been a strong focus on chip stacking technologies (e.g. 3D-ICs) in recent years.

Figure 1:
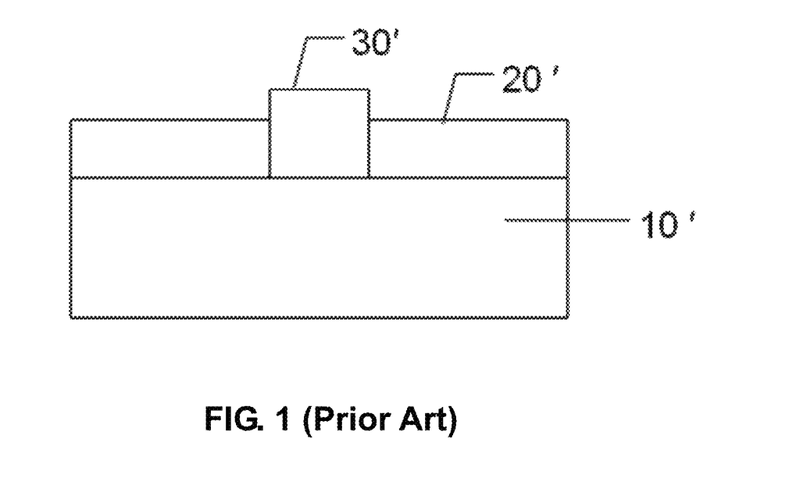
FIG. 1 illustrates a schematic cross-sectional view of a bonding chip.

In current chip stacking technologies, the chips are usually fabricated individually before stacking. As shown in FIG. 1, a chip may include a substrate 10', a dielectric layer 20' disposed on the substrate 10', and a metal pad 30' disposed in a recess in the dielectric layer 20'. The metal pad 30' is electrically connected to, for example, devices in the substrate 10'. The metal pad 30' may also be electrically connected to external electrical components. As shown in FIG. 1, a top surface of the dielectric layer 20' is located below a top surface of the metal pad 30'. A plurality of chips may be bonded together using, for example, thermocompression bonding, so as to form a stacked chip.

Figure 2:
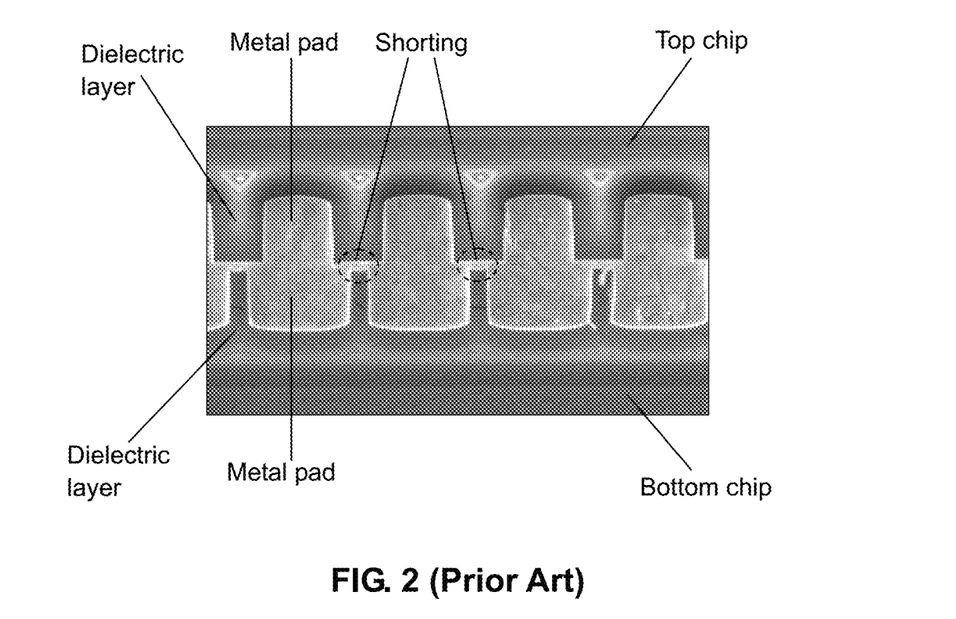
FIG. 2 is a scanning electron microscope (SEM) photograph of a cross-section of a stacked chip in which adjacent metal pads are deformed and connected to each other.

FIG. 2 is a scanning electron microscope (SEM) photograph of a cross-section of a stacked chip in which adjacent metal pads are deformed and connected to each other. During thermocompression bonding, the metal pads deform under the application of heat and pressure. In some instances, adjacent metal pads may deform and contact each other, which may result in shorting within the stacked chip (see dotted circled regions in FIG. 2). As devices scale, the density of the metal pads on the chip increases, which means that the pitch of the metal pads decreases. As the pitch or gap between adjacent metal pads decreases, the likelihood of adjacent metal pads deforming and contacting each other (during thermocompression bonding) increases.

Some methods have been proposed to mitigate the above shorting issue. For example, it has been proposed that reducing a width of the metal pads can increase the gap between adjacent metal pads. However, reducing the width of the metal pads may lower the alignment accuracy of the stacked chip, since it is more difficult to accurately align and bond the metal pads on a top chip and a bottom chip when the size of the metal pads is reduced. In particular, misalignment and poor bonding of the chips may lower the yield of the chip stacking process.

SUMMARY

The present disclosure addresses at least the above issues in the prior art.

According to an embodiment of the inventive concept, a chip is provided. The chip includes: a substrate; a dielectric layer disposed on the substrate, wherein the dielectric layer includes a first dielectric region and a second dielectric region surrounding an outer periphery of the first dielectric region, and wherein a top surface of the first dielectric region is disposed below a top surface of the second dielectric region; and a metal pad disposed in a through-hole in the first dielectric region and contacting a portion of the substrate.

In one embodiment, a height of the first dielectric region may range from about ⅓ to about ⅔ of a height of the second dielectric region.

In one embodiment, a width of the first dielectric region may range from about 1/10 to about ½ of a width of the metal pad.

In one embodiment, the first dielectric region and the second dielectric region may include $SiO_2$, SiOC, or $Si_3N_4$, and the metal pad may include Cu or Sn.

According to another embodiment of the inventive concept, a method of manufacturing a chip is provided. The method includes: providing a substrate; forming a dielectric layer on the substrate, wherein the dielectric layer includes a first dielectric region and a second dielectric region surrounding an outer periphery of the first dielectric region; forming a metal pad in a through-hole in the first dielectric region, wherein the metal pad contacts a portion of the substrate; and etching the dielectric layer so that a top surface of the first dielectric region is disposed below a top surface of the second dielectric region.

In one embodiment, etching the dielectric layer may further include: forming a photoresist layer covering the dielectric layer and the metal pad; removing a portion of the photoresist layer corresponding to a location of the metal pad using photolithography, so as to form an opening in the photoresist, wherein a width of the opening is greater than a width of the metal pad; etching the dielectric layer through the opening so that the top surface of the first dielectric region is disposed below the top surface of the second dielectric region; and removing the remaining photoresist layer.

In one embodiment, the dielectric layer may be etched such that a height of the first dielectric region ranges from about ⅓ to about ⅔ of a height of the second dielectric region.

In one embodiment, a width of the first dielectric region may range from about 1/10 to about ½ of a width of the metal pad.

In one embodiment, prior to removing the remaining dielectric layer, the metal pad may be cleaned so as to remove oxide residue on a surface of the metal pad.

In one embodiment, the first dielectric region and the second dielectric region may include $SiO_2$, SiOC, or $Si_3N_4$, and the metal pad may include Cu or Sn.

According to a further embodiment of the inventive concept, a method of manufacturing a stacked chip is provided. The method includes: providing a first chip and a second chip; and bonding a plurality of metal pads on the first chip to a plurality of metal pads on the second chip so as to form the stacked chip. Each of the first chip and the second chip further comprises: a substrate; a dielectric layer disposed on the substrate, wherein the dielectric layer includes a first dielectric region and a second dielectric region surrounding an outer periphery of the first dielectric region, and wherein a top surface of the first dielectric region is disposed below a top surface of the second dielectric region; and wherein each of the metal pads on the respective first and second chips is disposed in a through-hole in the first dielectric region and contacts a portion of the substrate.

In one embodiment, the method may further include: bonding the dielectric layer on the first chip to the dielectric layer on the second chip during the bonding of the metal pads on the first chip to the metal pads on the second chip.

In one embodiment, the method may further include: performing an annealing process on the stacked chip to remove defects on the first chip and the second chip.

In one embodiment, a height of the first dielectric region may range from about ⅓ to about ⅔ of a height of the second dielectric region.

In one embodiment, a width of the first dielectric region may range from about ⅒ to about ½ of a width of the metal pad.

In one embodiment, the first dielectric region and the second dielectric region may include $SiO_2$, SiOC, or $Si_3N_4$, and each of the metal pads may include Cu or Sn.

BRIEF DESCRIPTION OF THE DRAWINGS

The accompanying drawings, which are incorporated herein and constitute a part of the specification, illustrate different embodiments of the inventive concept and, together with the detailed description, serve to describe more clearly the inventive concept.

It is noted that in the accompanying drawings, for convenience of description, the dimensions of the components shown may not be drawn to scale. Also, same or similar reference numbers between different drawings represent the same or similar components.

DETAILED DESCRIPTION

Various embodiments of the inventive concept are next described in detail with reference to the accompanying drawings. It is noted that the following description of the different embodiments is merely illustrative in nature, and is not intended to limit the inventive concept, its application, or use. The relative arrangement of the components and steps, and the numerical expressions and the numerical values set forth in these embodiments do not limit the scope of the inventive concept unless otherwise specifically stated. In addition, techniques, methods, and devices as known by those skilled in the art, although omitted in some instances, are intended to be part of the specification where appropriate. It should be noted that for convenience of description, the sizes of the elements in the drawings may not be drawn to scale.

In the drawings, the sizes and/or relative sizes of layers and regions may be exaggerated for clarity. Like reference numerals denote the same elements throughout.

It should be understood that when an element or layer is referred to as being "in", "adjacent to", "connected to", or "coupled to" another element or layer, it can be directly on the other element or layer, adjacent, connected or coupled to the other element or layer. In some instances, one or more intervening elements or layers may be present. In contrast, when an element is referred to as being "directly on", "directly adjacent to", "directly connected to", or "directly coupled to" another element or layer, there are no intervening elements present or layer. It will be understood that, although the terms "first," "second," "third," etc. may be used herein to describe various elements, the elements should not be limited by those terms. Instead, those terms are merely used to distinguish one element from another. Thus, a "first" element discussed below could be termed a "second" element without departing from the teachings of the present inventive concept. As used herein, the term "and/or" includes any and all combinations of one or more of the associated listed items.

Spatially relative terms, such as "beneath", "below", "lower", "above", "upper" and the like, may be used herein for ease of description to describe one element or feature's spatial relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments and is not intended to limit the inventive concept. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art, and should not be interpreted in an idealized or overly formal sense unless expressly so defined herein.

Exemplary embodiments are described herein with reference to cross-sectional illustrations that are schematic illustrations of idealized exemplary embodiments (and intermediate structures) of the inventive concept. As such, variations from the shapes of the illustrations as a result of, for example, manufacturing techniques and/or tolerances, are to be expected. Thus, the exemplary embodiments should not be construed as being limited to the particular shapes of regions illustrated herein, but may also include deviations in shapes that result, for example, from manufacturing tolerances. The regions illustrated in the figures are schematic in nature, and their shapes are not intended to illustrate the actual shape of a region of a device, and should not be construed to limit the scope of the inventive concept.

It should be understood that the inventive concept is not limited to the embodiments described herein. Rather, the inventive concept may be modified in different ways to realize different embodiments.

Figure 3:
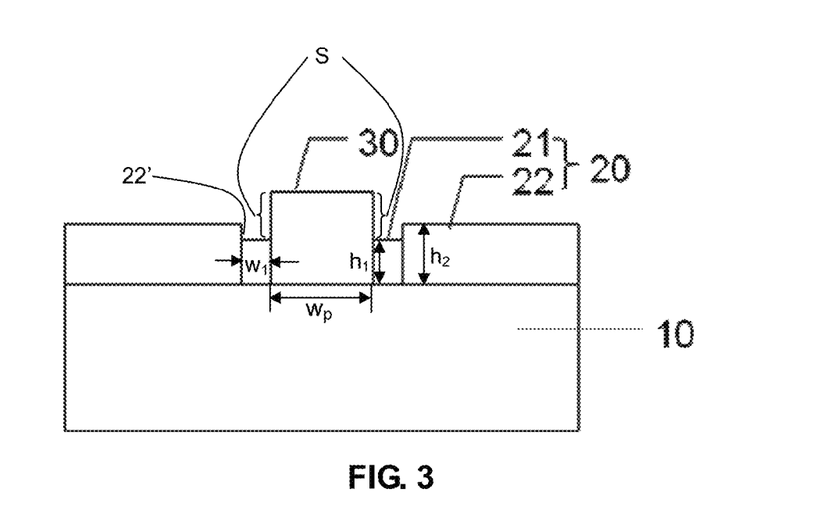
FIG. 3 illustrates a schematic cross-sectional view of a chip according to an embodiment.

FIG. 3 illustrates a schematic cross-sectional view of a chip according to an embodiment. Referring to FIG. 3, the chip includes a substrate 10 and a dielectric layer 20 disposed on the substrate 10. The dielectric layer 20 includes a first dielectric region 21 and a second dielectric region 22 surrounding an outer periphery of the first dielectric region 21. A top surface of the first dielectric region 21 is disposed below a top surface of the second dielectric region 22. The chip further includes a metal pad 30 disposed on a portion of the substrate 10. Specifically, the metal pad 30 is disposed in a recess in the first dielectric region 21. The metal pad 30 may be electrically connected to the substrate 10. Specifically, the metal pad 30 may be electrically connected to devices prefabricated in the substrate 10.

In the above embodiment, since the top surface of the first dielectric region 21 is disposed below the top surface of the second dielectric region 22, the volume of the portion of the metal pad 30 protruding above the first/second dielectric regions 21/22 is increased (compared to the case in which the first dielectric region 21 is absent, and the metal pad 30 is surrounded by only one dielectric region/layer, for example as shown in FIG. 1).

Referring to FIG. 3, a surface area S is defined by an area of the exposed surfaces of the metal pad 30 that are perpendicular to the top surface of the substrate 10. As shown in FIG. 3, the surface area S corresponds to the area of the exposed sidewalls of the metal pad 30. Accordingly, the surface area S is increased in the example of FIG. 3 compared to that of FIG. 1.

In one embodiment, two chips may be bonded together to form a stacked chip. A constant force F may be applied during the bonding process. A stress σ on the metal pad 30 is proportional to the ratio of the applied force F over the surface area S (i.e. σ is proportional to F/S). The stress σ on the metal pad 30 is lower since the surface area S is increased in the example of FIG. 1. As a result, the metal pad 30 will undergo less deformation during the bonding process, and the risk of adjacent metal pads 30 deforming and contacting each other is lowered. Accordingly, the yield of the bonding process and the reliability of the exemplary stacked chip will be improved.

In addition, during the bonding process, the metal pad 30 will deform and extend onto the top surface of the first dielectric region 21. However, since a height $h_1$ of the first dielectric region 21 is lower than a height $h_2$ of the second dielectric region 22, an edge sidewall 22' of the second dielectric region 22 can prevent the deforming metal pad 30 from further extending onto the second dielectric region 22. As a result, the risk of adjacent metal pads 30 deforming and contacting each other is lower. Accordingly, the yield of the bonding process and the reliability of the exemplary stacked chip will be improved.

In the above embodiment, the extent of deformation of the metal pad 30 during the bonding process is influenced by the height $h_1$ of the first dielectric region 21. The height $h_1$ of the first dielectric region 21 can be modified to meet different process requirements/limitations. For example, in one embodiment, the height $h_1$ of the first dielectric region 21 may range from about ⅓ to about ⅔ of the height $h_2$ of the second dielectric region 22.

However, if the height $h_1$ of the first dielectric region 21 is more than ⅔ of the height $h_2$ of the second dielectric region 22, the surface area S will be greatly reduced, which leads to a higher stress σ on the metal pad 30. As a result, the deformation of the metal pad 30 will be greater. Accordingly, the efficiency of the first dielectric region 21 in preventing adjacent metal pads 30 from contacting each other will be reduced if the height $h_1$ of the first dielectric region 21 is too high.

Conversely, if the height $h_1$ of the first dielectric region 21 is less than ⅓ of the height $h_2$ of the second dielectric region 22, the adhesion between the metal pad 30 and the first dielectric region 21 will be reduced since there is less interfacial area. As a result, the first dielectric region 21 may not be able to provide sufficient structural support for the metal pad 30. In some instances, the metal pad 30 may move or severely deform during the bonding process due to lack of support from the surrounding first dielectric region 21. Accordingly, the yield of the bonding process and the reliability of the stacked chip may deteriorate if the height $h_1$ of the first dielectric region 21 is too low.

In the above embodiment, the bonding process window of the metal pad 30 is also influenced by a width of the first dielectric region 21. Accordingly, the width of the first dielectric region 21 may be modified to meet different process requirements/limitations. In one embodiment, the first dielectric region 21 is formed as an annular ring surrounding an outer periphery of the metal pad 30. A width $w_1$ of the first dielectric region 21 is given by a width of the annular ring, and is measured from an edge of the second dielectric region 22 to a nearest adjacent edge of the metal pad 30. A width $w_p$ of the metal pad 30 is measured from opposite edges of the metal pad 30. In one embodiment, the width $w_1$ of the first dielectric region 21 may range from about 1/10 to about ½ of the width $w_p$ of the metal pad 30.

However, if the width $w_1$ of the first dielectric region 21 is less than 1/10 of the width $w_p$ of the metal pad 30, a large force will be exerted by the deforming metal pad 30 onto the edge sidewall 22' of the second dielectric region 22 during the bonding process, which may subsequently cause damage to the second dielectric region 22. Accordingly, the yield of the bonding process and the reliability of the stacked chip may deteriorate if $w_1$ is less than 1/10 of $w_p$.

Conversely, if the width $w_1$ of the first dielectric region 21 is more than ½ of the width $w_p$ of the metal pad 30, the density of the metal pads 30 on the chip will be lower (since the pitch of the metal pads 30 is now higher). In particular, certain chip scaling requirements may not be met if $w_1$ is more than ½ of $w_p$.

The dielectric layer 20 and the metal pad 30 may include various materials known to those skilled in the art. In one embodiment, the first dielectric region 21 and the second dielectric region 22 may include $SiO_2$, $SiOC$, or $Si_3N_4$. In one embodiment, the metal pad may include Cu or Sn.

Figure 4:
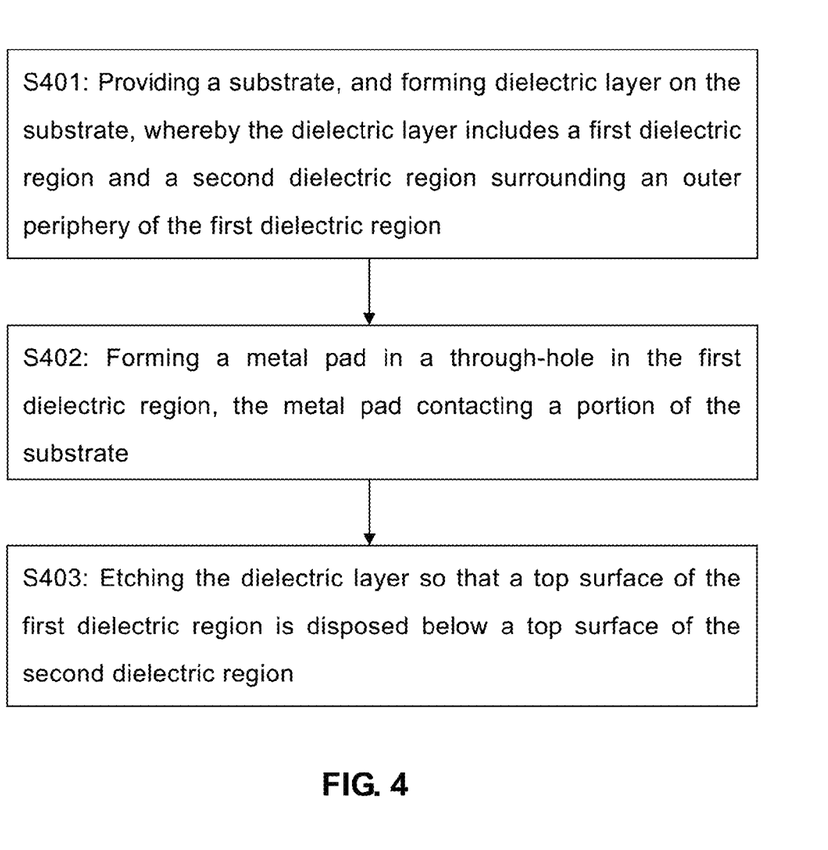
FIG. 4 is a flowchart illustrating a method of manufacturing the chip of FIG. 3 according to an embodiment.

FIG. 4 is a flowchart illustrating a method of manufacturing a chip according to an embodiment. The method of FIG. 4 includes the following steps.

In Step S401, a substrate is provided. A dielectric layer is formed on the substrate. The dielectric layer includes a first dielectric region and a second dielectric region surrounding an outer periphery of the first dielectric region.

In Step S402, a metal pad is formed in a through-hole in the first dielectric region, the metal pad contacting a portion of the substrate.

In Step S403, the dielectric layer is etched so that a top surface of the first dielectric region is disposed below a top surface of the second dielectric region.

Next, the method of FIG. 4 will be described in greater detail with reference to FIGS. 5, 6, 7, 7A, 7B, and 7C. Specifically, FIGS. 5, 6, 7, 7A, 7B, and 7C depict schematic cross-sectional views of the chip of FIG. 3 at different stages of manufacture.

Figure 5:
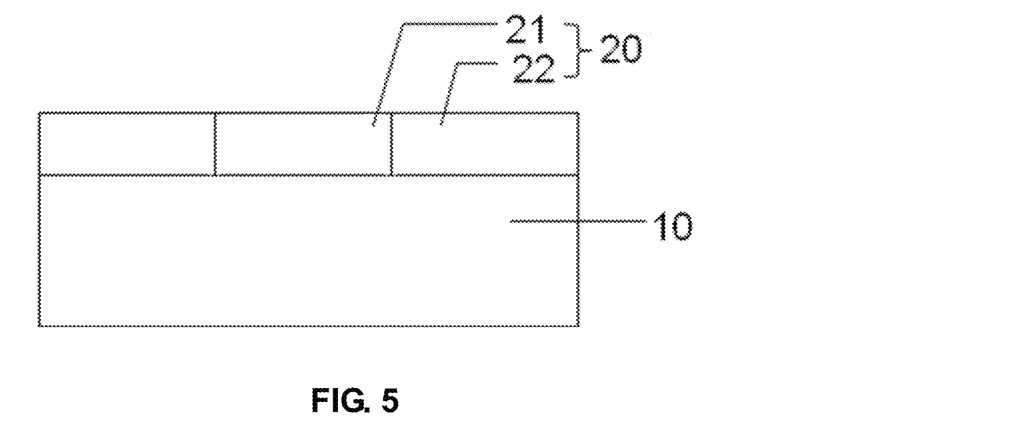
FIGS. 5, 6, 7, 7A, 7B, and 7C depict schematic cross-sectional views of the chip of FIG. 3 at different stages of manufacture according to the exemplary method of manufacturing the chip.

Referring to FIG. 5, a substrate 10 is provided. A dielectric layer 20 is formed on the substrate 10. The dielectric layer 20 includes a first dielectric region 21 and a second dielectric region 22 surrounding an outer periphery of the first dielectric region 21. The dielectric layer 20 is made of an insulating material, and serves to electrically isolate subsequently-formed metal pads from one another. In one embodiment, the dielectric layer 20 may include $SiO_2$, SiOC, or $Si_3N_4$.

The dielectric layer 20 may be formed using, for example, chemical vapor deposition, sputtering, or evaporation. In one embodiment, the dielectric layer 20 includes $SiO_2$ formed using a chemical vapor deposition process. In one embodiment, the process conditions for the chemical vapor deposition may include: using tetramethylsilane and oxygen as the reactive gases; a flow rate of the tetramethylsilane ranging from about 1000 sccm to about 3000 sccm; a flow rate of the oxygen ranging from about 2000 sccm to about 5000 sccm; a substrate deposition temperature ranging from about 500° C. to about 800° C.; and a deposition time ranging from about 1 min to about 3 min.

At least one device (not shown) may be formed on the substrate 10. The device may include transistors, diodes, shallow trench isolation structures, interconnects, etc. It should be appreciated that the type and structure of the device may be selected based on device requirements. Since the devices and methods for forming the aforementioned devices are known to those skilled in the art, a detailed description of those devices and methods shall be omitted.

Figure 6:
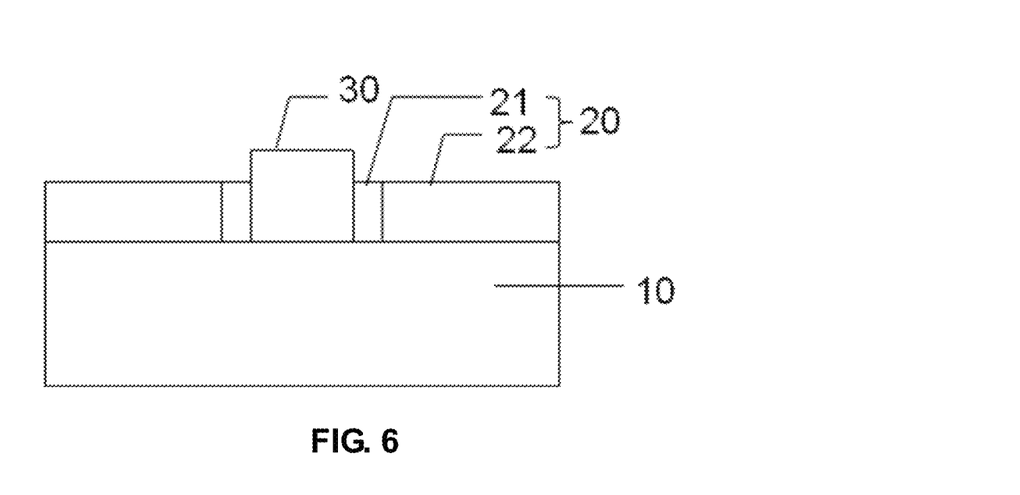

Next, referring to FIG. 6, a metal pad 30 is formed extending through a recess in the first dielectric region 21 and contacting a portion of the substrate 10.

In one embodiment, forming the metal pad 30 may include: forming a patterned photoresist layer on the dielectric layer 20; etching a through-hole in the dielectric layer 20 using the patterned photoresist layer as a mask, the through-hole exposing a portion of the substrate 10; and filling the through-hole with a metal so as to form the metal pad 30.

The metal pad 30 may include metals that are commonly used in bonding processes. In one embodiment, the metal pad may include Cu or Sn.

In one embodiment, after the through-hole has been filled with a metal, a chemical mechanical polishing (CMP) process may be performed to planarize the top surface of the metal, so as to form the metal pad 30.

The metal pad 30 is electrically connected to the device(s) in the substrate 10.

In one embodiment, a barrier layer may be formed on the bottom surface and sidewalls of the through-hole before filling the through-hole with a metal. The barrier layer prevents metal atoms in the metal pad 30 from diffusing into the dielectric layer 20. In addition, the barrier layer can improve adhesion strength between the metal pad 30 and the dielectric layer 20. The barrier layer may be a TaN layer, a Ta layer, or a stacked layer comprising a TaN layer and a Ta layer. Next, a metal seed layer may be formed on the barrier layer. The metal seed layer may be formed of Cu.

The barrier layer and the metal seed layer may be formed using chemical vapor deposition or sputtering.

In one embodiment, after the metal pad 30 has been formed, the dielectric layer 20 is etched back to increase the portion of the metal pad 30 protruding above the dielectric layer 20, so as to ensure that the metal pads 30 on the chip can be well-bonded during the subsequent bonding process. The dielectric layer 20 may be etched using wet etching, for example, using a HF wet etch. In one embodiment, the process conditions for the HF wet etch may include: using 30%-50% concentrated HF as the etching solution; an etching temperature ranging from about 25° C. to about 50° C.; and an etch time ranging from about 30 secs to about 120 secs.

Figure 7:
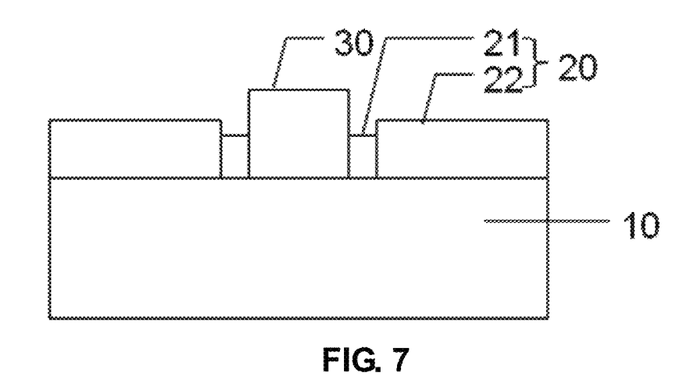

Next, referring to FIG. 7, the dielectric layer 20 is etched so that a top surface of the first dielectric region 21 is disposed below a top surface of the second dielectric region 22. The aforementioned etching of the dielectric layer 20 will be described in more detail below with reference to FIGS. 7A, 7B, and 7C.

Figure 7A:
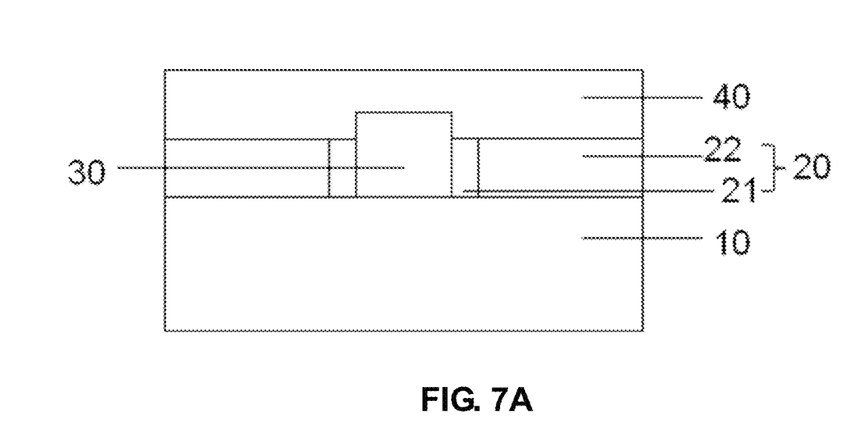

Referring to FIG. 7A, a photoresist layer 40 is formed covering the dielectric layer 20 and the metal pad 30.

Figure 7B:
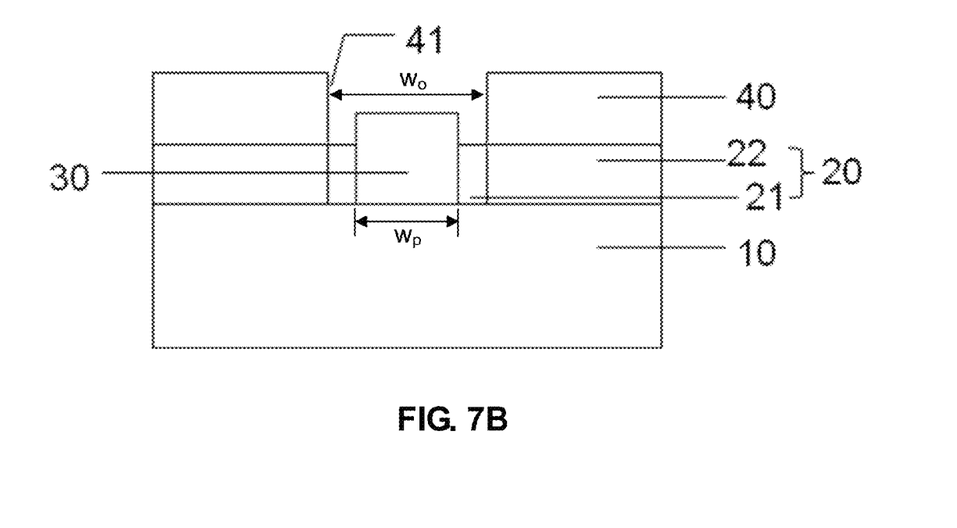

Referring to FIG. 7B, a portion of the photoresist layer 40 corresponding to the location of the metal pad 30 is removed using photolithography, so as to form an opening 41 in the photoresist layer 40. As shown in FIG. 7B, a width $w_o$ of the opening 41 is greater than the width $w_p$ of the metal pad 30.

Figure 7C:
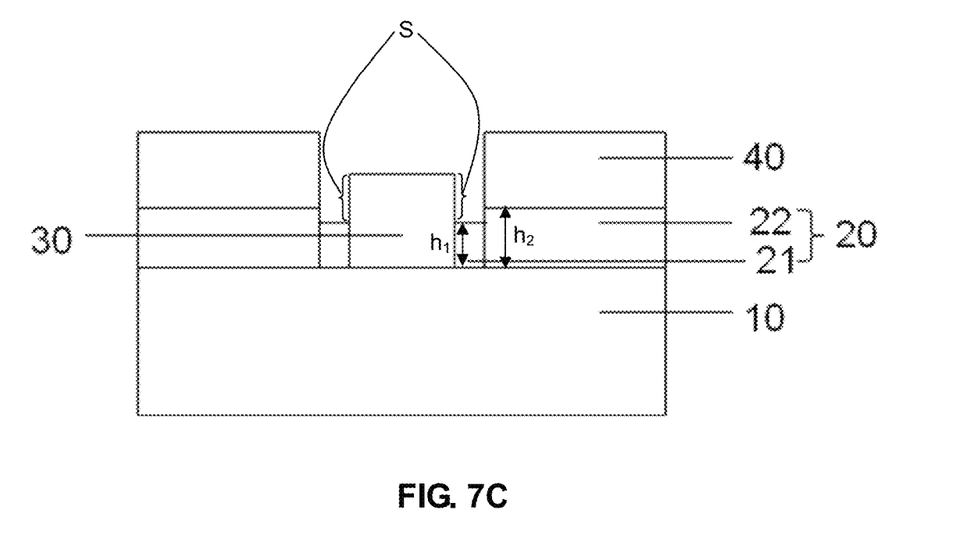

Referring to FIG. 7C, the dielectric layer 20 is etched through the opening 41 so that the top surface of the first dielectric region 21 is disposed below the top surface of the second dielectric region 22. The remaining photoresist layer 40 is then removed, thereby producing the structure shown in FIG. 7.

The photoresist layer 40 may be formed using, for example, spin coating or a deposition method.

In one embodiment, an antireflective coating may be formed above or below the photoresist layer 40 so as to improve the accuracy of the photolithography process. The photolithography process includes exposure and development steps which are known to those skilled in the art. Accordingly, a detailed description of the photolithography process shall be omitted.

In the example of FIG. 7C, the dielectric layer 20 may be etched using wet etching, for example, using a HF wet etch. In one embodiment, the process conditions for the HF wet etch may include: using 30%-50% concentrated HF as the etching solution; an etching temperature ranging from about 25° C. to about 50° C.; and an etch time ranging from about 60 secs to about 300 secs.

In one embodiment, the dielectric layer 20 is etched such that the height $h_1$ of the first dielectric region 21 ranges from about ⅓ to about ⅔ of the height $h_2$ of the second dielectric region 22 (see FIG. 7C).

As previously mentioned, if the height $h_1$ of the first dielectric region 21 is more than ⅔ of the height $h_2$ of the second dielectric region 22, the surface area S will be greatly reduced, which leads to a higher stress σ on the metal pad 30. As a result, the deformation of the metal pad 30 will be greater. Accordingly, the efficiency of the first dielectric region 21 in preventing adjacent metal pads 30 from contacting each other will be reduced if the height $h_1$ of the first dielectric region 21 is too high.

Conversely, if the height $h_1$ of the first dielectric region 21 is less than ⅓ of the height $h_2$ of the second dielectric region 22, the adhesion between the metal pad 30 and the first dielectric region 21 will be reduced since there is less interfacial area. As a result, the first dielectric region 21 may not be able to provide sufficient structural support for the metal pad 30. In some instances, the metal pad 30 may move or severely deform during the bonding process due to lack of support from the surrounding first dielectric region 21. Accordingly, the yield of the bonding process and the reliability of the stacked chip may deteriorate if the height $h_1$ of the first dielectric region 21 is too low.

As previously mentioned, the remaining photoresist layer 40 is removed after the dielectric layer 20 has been etched. The remaining photoresist layer 40 may be removed using, for example, wet etching or ashing. In one embodiment, the remaining photoresist layer 40 may be removed by oxygen plasma ashing. In one embodiment, the process conditions for the oxygen plasma ashing may include: using $O_2$ and $N_2H_2$ as the reactive gases; a flow rate of the $O_2$ ranging from about 2000 sccm to about 5000 sccm; a flow rate of the $N_2H_2$ ranging from about 200 sccm to about 400 sccm; a reaction chamber pressure ranging from about 500 mT to about 2000 mT; an excitation power ranging from about 600 W to about 1000 W; and a processing time ranging from about 30 secs to about 90 secs.

In one embodiment, prior to removing the remaining photoresist layer 40, the metal pad 30 may be cleaned so as to remove oxide residue on the surface of the metal pad 30. The metal pad 30 may be cleaned using cleaning agents such as SPM or SC1 solutions. In one embodiment, the metal pad 30 may be cleaned using an SC1 solution, and the process conditions may include: the SC1 solution comprising $H_2O_2$, $NH_4OH$, and $H_2O$ in a volume ratio of x:y:z, respectively, whereby x is 1, y ranges from about 2 to 10, and z ranges from about 20 to 50; a flow rate of the SC1 solution ranging from about 1 L/min to about 3 L/min; a washing temperature ranging from about 20° C. to about 45° C.; and a washing time ranging from about 30 secs to about 100 secs.

Next, a method of manufacturing a stacked chip according to an embodiment will be described. The method includes: providing a first chip and a second chip, and bonding metal pads on the first chip to metal pads on the second chip so as to form the stacked chip. At least one of the first and second chips may correspond to the exemplary chip illustrated in FIG. 3. The deformation of the metal pads in the exemplary stacked chip will be less compared those in conventional stacked chips, and therefore the risk of adjacent metal pads shorting will be lower on the exemplary stacked chip. Accordingly, the yield of the bonding process and the reliability of the exemplary stacked chip will be improved compared to the prior art.

In one embodiment, the dielectric layer on the first chip is also bonded to the dielectric layer on the second chip during the bonding of the metal pads. It is noted that a good interface formed between the bonded dielectric layers can restrict movement of the deforming metal pads, and prevent shorting between adjacent metal pads. Accordingly, the yield of the bonding process and the reliability of the exemplary stacked chip can be further improved in the above embodiment.

In one embodiment, the metal pads on the first and second chips, and the dielectric layers on the first and second chips, may be bonded together using thermocompression bonding. In one embodiment, the process conditions for the thermocompression bonding may include: a bonding temperature ranging from about 300° C. to about 500° C.; a bonding pressure ranging from about 1 KN to about 5 KN; and a bonding time ranging from about 5 mins to about 20 mins.

In one embodiment, the surfaces of the first chip and the second chip are cleaned before the bonding process, so as to remove surface defects (such as organic residue). The surfaces of the first chip and the second chip may be cleaned using cleaning agents such as SPM or SC1 solutions. The cleaning methods may include a rotary spray method or an ultrasonic cleaning method. After the bonding process, an annealing process may be performed on the stacked chip to remove defects (such as dislocations, lattice distortion, holes, etc.) on the first and second chips.

Embodiments of a chip, a method of forming the chip, a stacked chip, and a method for forming the stacked chip, have been described in the foregoing description. To avoid obscuring the inventive concept, details that are well-known in the art may have been omitted. Nevertheless, those skilled in the art would be able to understand the implementation of the inventive concept and its technical details in view of the present disclosure.

The different embodiments of the inventive concept have been described with reference to the accompanying drawings. However, the different embodiments are merely illustrative and are not intended to limit the scope of the inventive concept. Furthermore, those skilled in the art would appreciate that various modifications can be made to the different embodiments without departing from the scope of the inventive concept.

What is claimed is:

1. A chip comprising:
a substrate;
a dielectric layer disposed on the substrate, wherein the dielectric layer includes a first dielectric region and a second dielectric region surrounding an outer periphery of the first dielectric region, and wherein a top surface of the first dielectric region is disposed below a top surface of the second dielectric region; and
a metal pad disposed in a through-hole in the first dielectric region and contacting a portion of the substrate.

2. The chip according to claim 1, wherein a height of the first dielectric region ranges from about ⅓ to about ⅔ of a height of the second dielectric region.

3. The chip according to claim 1, wherein a width of the first dielectric region ranges from about 1/10 to about ½ of a width of the metal pad.

4. The chip according to claim 1, wherein the first dielectric region and the second dielectric region includes $SiO_2$, SiOC, or $Si_3N_4$, and
wherein the metal pad includes Cu or Sn.

5. A method of manufacturing a chip, comprising:
providing a substrate;
forming a dielectric layer on the substrate, wherein the dielectric layer includes a first dielectric region and a second dielectric region surrounding an outer periphery of the first dielectric region;
forming a metal pad in a through-hole in the first dielectric region, wherein the metal pad contacts a portion of the substrate; and
etching the dielectric layer so that a top surface of the first dielectric region is disposed below a top surface of the second dielectric region.

6. The method according to claim 5, wherein etching the dielectric layer further comprises:
forming a photoresist layer covering the dielectric layer and the metal pad;
removing a portion of the photoresist layer corresponding to a location of the metal pad using photolithography, so as to form an opening in the photoresist, wherein a width of the opening is greater than a width of the metal pad;
etching the dielectric layer through the opening so that the top surface of the first dielectric region is disposed below the top surface of the second dielectric region; and
removing the remaining photoresist layer.

7. The method according to claim 6, wherein the dielectric layer is etched such that a height of the first dielectric region ranges from about ⅓ to about ⅔ of a height of the second dielectric region.

8. The chip according to claim 5, wherein a width of the first dielectric region ranges from about 1/10 to about ½ of a width of the metal pad.

9. The method according to claim 6, wherein prior to removing the remaining dielectric layer, the metal pad is cleaned so as to remove oxide residue on a surface of the metal pad.

10. The method according to claim 5, wherein the first dielectric region and the second dielectric region includes $SiO_2$, SiOC, or $Si_3N_4$, and
wherein the metal pad includes Cu or Sn.

11. A method of manufacturing a stacked chip, comprising:
providing a first chip and a second chip; and
bonding a plurality of metal pads on the first chip to a plurality of metal pads on the second chip so as to form the stacked chip,
wherein each of the first chip and the second chip comprises:
a substrate;
a dielectric layer disposed on the substrate, wherein the dielectric layer includes a first dielectric region and a second dielectric region surrounding an outer periphery of the first dielectric region, and wherein a top surface of the first dielectric region is disposed below a top surface of the second dielectric region; and
wherein each of the metal pads on the respective first and second chips is disposed in a through-hole in the first dielectric region and contacts a portion of the substrate.

12. The method according to claim 11, further comprising:
bonding the dielectric layer on the first chip to the dielectric layer on the second chip during the bonding of the metal pads on the first chip to the metal pads on the second chip.

13. The method according to claim 11, further comprising:
performing an annealing process on the stacked chip to remove defects on the first chip and the second chip.

14. The method according to claim 11, wherein a height of the first dielectric region ranges from about ⅓ to about ⅔ of a height of the second dielectric region.

15. The method according to claim 11, wherein a width of the first dielectric region ranges from about 1/10 to about ½ of a width of the metal pad.

16. The method according to claim 11, wherein the first dielectric region and the second dielectric region includes $SiO_2$, SiOC, or $Si_3N_4$, and
wherein each of the metal pads includes Cu or Sn.

* * * * *